(12) United States Patent
Kawano

(10) Patent No.: US 7,242,262 B2
(45) Date of Patent: Jul. 10, 2007

(54) PULSE POLARITY MODULATION CIRCUIT

(75) Inventor: Yoichi Kawano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 217 days.

(21) Appl. No.: 11/075,760

(22) Filed: Mar. 10, 2005

(65) Prior Publication Data
US 2006/0114034 A1    Jun. 1, 2006

(30) Foreign Application Priority Data
Nov. 30, 2004    (JP)    ............................. 2004-346935

(51) Int. Cl.
*H03K 7/00* (2006.01)
(52) U.S. Cl. ...................................... 332/106; 332/112
(58) Field of Classification Search ................ 332/106, 332/112
See application file for complete search history.

(56) References Cited

U.S. PATENT DOCUMENTS 3,381,088 A    4/1968    Lentz et al.
4,195,237 A    3/1980    Meslener
6,735,238 B1    5/2004    McCorkle

FOREIGN PATENT DOCUMENTS

| JP | 03-027622 A | 2/1991 |
|----|-------------|--------|
| JP | 03254219    | 11/1991 |
| JP | 09-074428 A | 3/1997 |

OTHER PUBLICATIONS

Kentaro Kanai et al; Development of Millimeter-Wave Passive Imaging Array; Journal C-2-103 of the 2003 Comprehensive Conference of The Institute of Electronics, Information and Communication Engineers; p. 135.

*Primary Examiner*—Arnold Kinkead
(74) *Attorney, Agent, or Firm*—Arent Fox LLP

(57) ABSTRACT

In order to provide a high-speed-pulse polarity modulation circuit for realizing low power consumption and miniaturization and reducing noise occurring at a middle level which is a baseline for a bipolar pulse, a modulation circuit for converting a unipolar pulse into a bipolar pulse in accordance with a value of input data is structured such that differential transistor pairs are double stacked, and one of the differential transistor pairs in an upper stage outputs polarity modulation pulses, and a middle potential between logic high and low is applied to the gates of the other differential transistor pair the gates of which are coupled together.

7 Claims, 8 Drawing Sheets

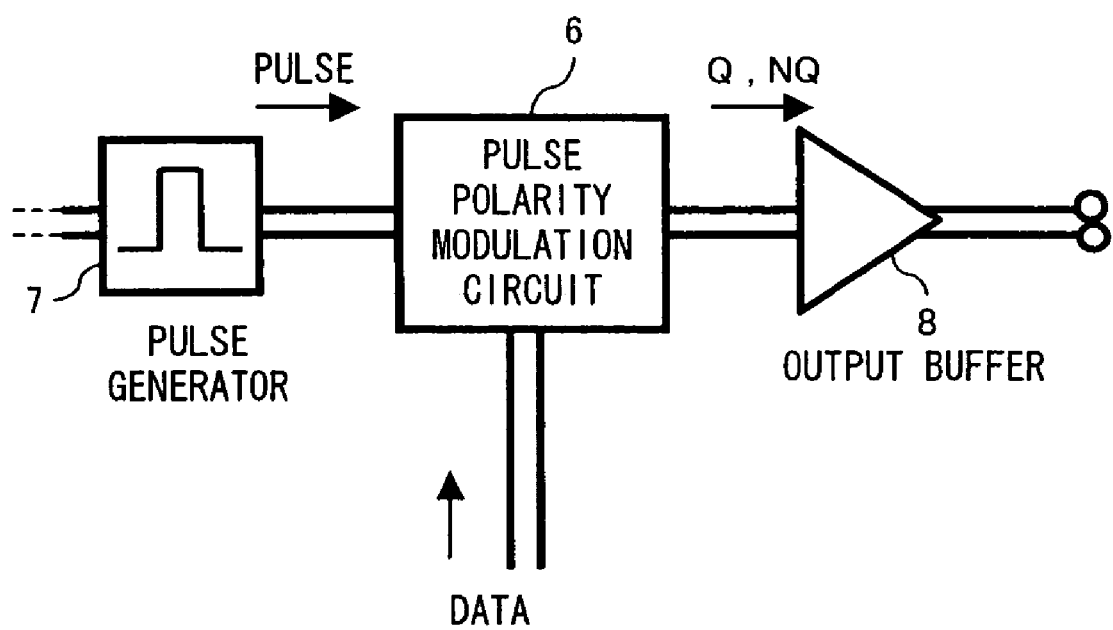
F I G. 4

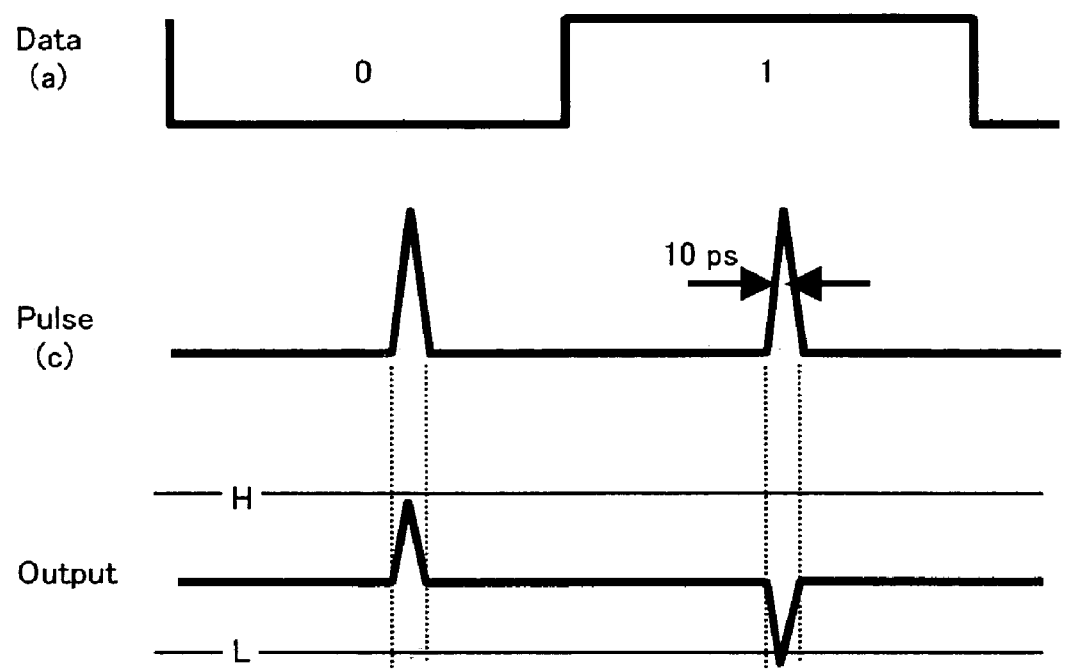
F I G. 5

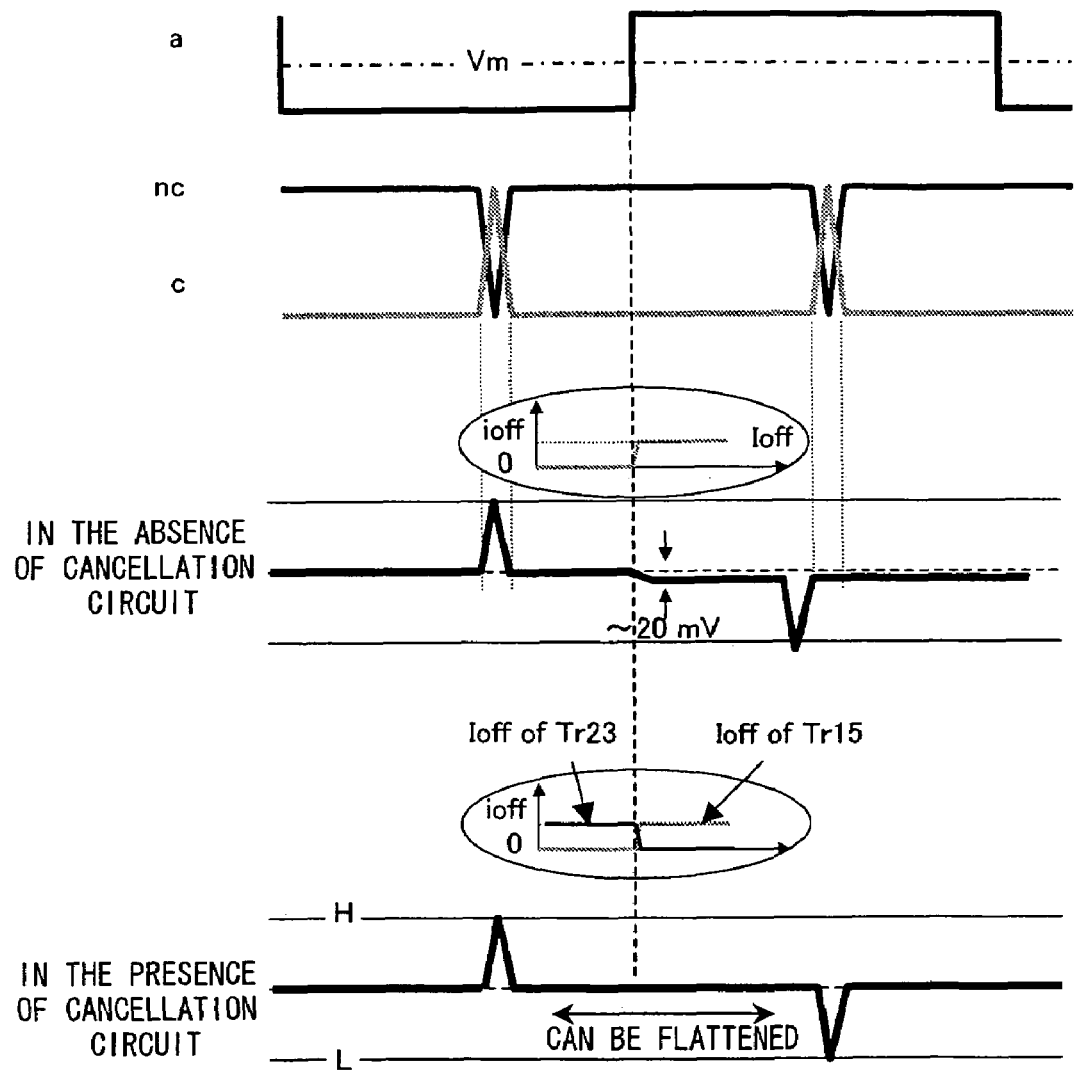
F I G. 8

PULSE POLARITY MODULATION CIRCUIT

CROSS-REFERENCE TO RELATED APPLICATIONS

This application is based upon and claims the benefit of priority from the prior Japanese Patent Application No. 2004-346935 filed on Nov. 30, 2004, the entire contents of which are incorporated herein by reference.

BACKGROUND OF THE INVENTION

1. Field of the Invention

The present invention relates to an ultrafast integrated circuit used for ultra-wide-band communications for example and a technique of generating an ultrashort pulse required for the communications, and more particularly, to a pulse polarity modulation circuit for converting a unipolar pulse into a bipolar pulse.

2. Description of the Related Art

There is a general requirement in many communication devices, to convert a unipolar signal into a bipolar signal. It is desirable for this kind of unipolar/bipolar converter to be as small as possible and have low power consumption and a low-noise characteristic.

Particularly, in ultra-wide-band communications as referred to in the present invention, an ultrashort pulse whose full width at half maximum is not more than 10 ps is generated and a unipolar pulse is converted into a bipolar pulse as required. It is desirable for this kind of pulse circuit to be a differential circuit which has exceptional switching speed.

The following document describes a conventional example of the unipolar/bipolar converter.

Patent document 1: Published Japanese Patent Application No. 3-27622 "U/B CONVERTER"

This document discloses a circuit for converting a unipolar signal into a bipolar signal with the outputs of dual-circuit pulse generators combined. FIG. 1 is a block diagram of a unipolar/bipolar converter similar to this circuit. In FIG. 1, the outputs of pulse generators which generate a positive-polarity signal and a negative-polarity signal respectively are combined and output through an output buffer.

FIG. 2 is an example of an operation time chart of the circuit in FIG. 1. Positive-polarity pulses a and negative-polarity pulses b are combined, and bipolar pulses Q are obtained. Here, positive-polarity pulses a and negative-polarity pulses b are generally different in frequency.

In the converter of patent document 1, however, there is a problem that it is difficult to realize low power consumption and space saving because dual-circuit pulse generators are required. Further, as a pulse circuit for ultra-wide-band communication, it is desirable to use the differential circuit as described; however, the gain of the differential circuit attains a maximum around a logic threshold value which is the logic mid-point (0 point); therefore, if minute noise occurs around the middle level, there is a problem that the noise is amplified to a large degree by an amplifier circuit generally placed at a subsequent stage, and additional circuit design is required to keep the middle level flat.

SUMMARY OF THE INVENTION

In view of the above problems, it is therefore an object of the present invention to provide a pulse polarity modulation circuit that can realize low power consumption and miniaturization and reduce noise at a middle level.

In the pulse polarity modulation circuit according to one aspect of the present invention, differential transistor pairs are double stacked, and two transistors constituting a differential transistor pair in a lower stage are coupled to their respective differential transistor pairs in an upper stage.

In the pulse polarity modulation circuit according to the aspect of the present invention, one of the differential transistor pairs in the upper stage, that is, a differential transistor pair 2 outputs polarity modulation pulses, and a middle potential between logic high and low is applied to the gates of the other differential transistor pair, that is, a differential transistor pair 3, with the gates coupled together.

According to the aspect of the present invention, the pulse polarity modulation circuit can be constructed with a single pulse generator, so that low power consumption and space saving can be realized. Further, noise at the middle level can be reduced; therefore, noise including amplifier noise can be effectively suppressed greatly contributing to the performance improvement of an ultrafast pulse communications system.

Other and further objects, features and advantages of the invention will become evident in the following description.

BRIEF DESCRIPTION OF THE DRAWINGS

FIG. 4 is a block diagram of a pulse polarity modulation system according to an embodiment of the present invention;

FIG. 5 is an operation time chart of the pulse polarity modulation circuit of FIG. 4;

FIG. 8 is a time chart explaining the operation of a switching noise cancellation section of FIG. 6.

DESCRIPTION OF THE PREFERRED EMBODIMENT

Figure 1:
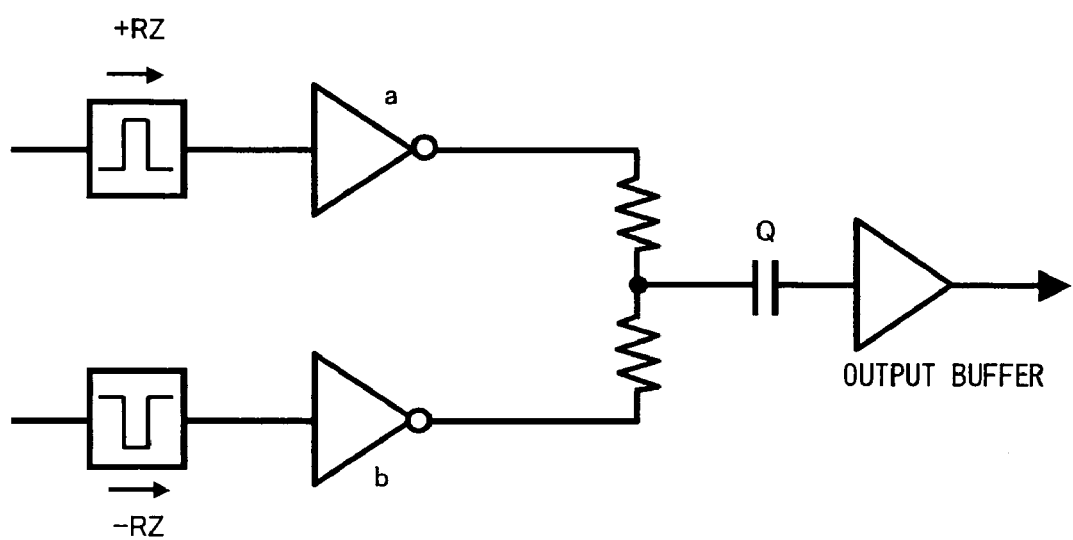
FIG. 1 is a diagram showing a conventional example of a unipolar/bipolar converter.
Figure 2:
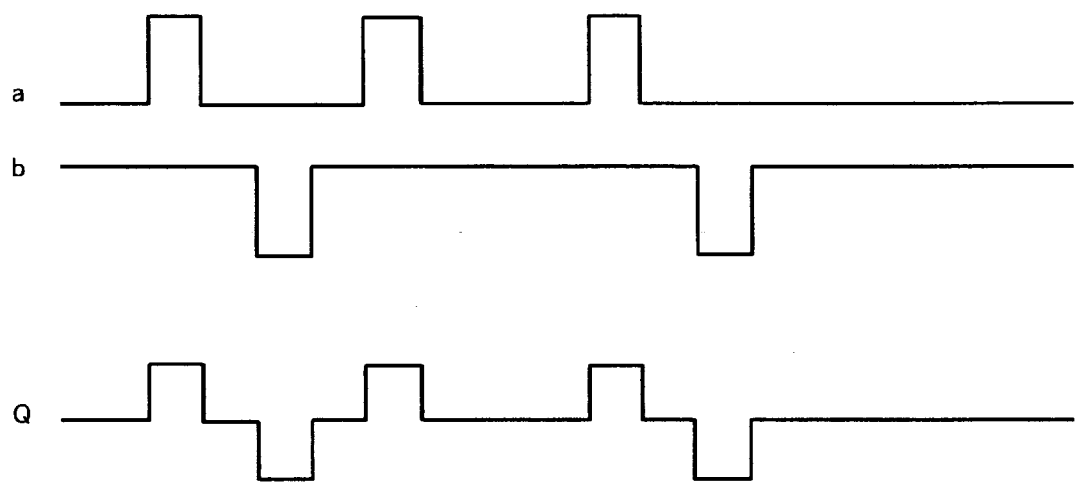
FIG. 2 is an operation time chart of the conventional circuit of FIG. 1.
Figure 3:
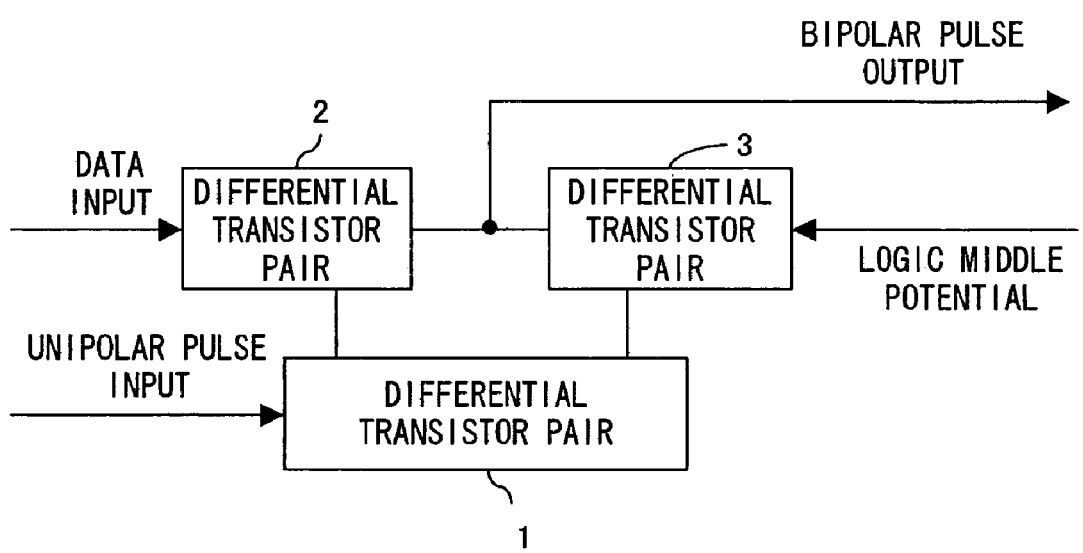
FIG. 3 is the principle block diagram of a pulse polarity modulation circuit according to the present invention.

FIG. 3 is the principle block diagram of a pulse polarity modulation circuit according to the present invention. FIG. 3 shows the principle structure of the pulse polarity modulation circuit in which differential transistor pairs are double stacked and two transistors constituting a differential transistor pair 1 in a lower stage are coupled to their respective differential transistor pairs 2 and 3 in an upper stage.

In the pulse polarity modulation circuit according to the present invention, one of the differential transistor pairs in the upper stage, that is, the differential transistor pair 2 outputs polarity modulation pulses. The gates of the other differential transistor pair, that is, the differential transistor pair 3, are coupled together, and a middle potential between logic high and low is applied to the gates Thus, in the pulse polarity modulation circuit according to the present invention, by applying the logic middle potential to the gates of the differential transistor pair 3 in the upper stage, bipolar pulses of a positive-going pulse from the middle level and a negative-going pulse from the middle level are obtained.

In this embodiment, data input and reverse data input can be provided to the respective gates of the differential transistor pair 2 in the upper stage, and unipolar input pulse and its reverse input pulse can be provided to the respective gates of the differential transistor pair 1 in the lower stage. Further, transistors of the differential transistor pair 3 can be connected to the polarity modulation pulse output terminals of the differential transistor pair 2.

The pulse polarity modulation circuit according to the present invention can further comprise a switching noise cancellation circuit connected to the output terminals of the differential transistor pair 2 which outputs the polarity modulation pulse.

In this case, the switching noise cancellation circuit can comprise a differential transistor pair that is connected to the output terminals of the differential transistor pair 2 with the sources coupled together and a transistor connected to the coupled sources of the differential transistor pair. Further, in the switching noise cancellation circuit, a potential that maintains the transistor in the OFF state with respect to any D.C. offset can be applied to the gate of the transistor connected to the coupled sources, and data input and reverse data input can be provided to the respective gates of the source-coupled differential transistor pair.

Thus, the differential transistor pair and the transistor connected to the coupled sources constituting the switching noise cancellation circuit are equivalent to the differential transistor pair 2 and the transistor connected to the differential transistor pair 2 of the differential transistor pair 1 in the lower stage of FIG. 3, and can prevent any change in the middle potential due to leakage current of transistors before and after data transitions between "0" and "1".

Further, an amplifier that amplifies the polarity modulation pulse is connected to the output of the pulse polarity modulation circuit of the present invention. The amplifier amplifies the output of the pulse polarity modulation circuit as necessary. By providing input in which the deviation (noise) from the middle level before and after the data transitions between "0" and "1" is reduced to the amplifier, increase in noise can be prevented.

FIG. 4 is a general block diagram of a pulse polarity modulation system that uses the pulse polarity modulation circuit according to the present invention. In FIG. 4, the output of a pulse generator 7 and data that is "0" or "1" are provided to a pulse polarity modulation circuit 6 which is realized by the present invention. A unipolar pulse output by the pulse generator 7 is modulated by the data value, and the modulation result is output via an output buffer 8. The output buffer 8 is an amplifier that generally has a large gain rather than a mere buffer. As described later, if there is minute noise at the logic middle level of the output of the pulse polarity modulation circuit 6, such noise is greatly amplified by the output buffer 8. It is desired that the middle level of the output of the pulse polarity modulation circuit 6 has a flat output characteristic without noise.

FIG. 5 is an operation time chart of a pulse modulation in the system of FIG. 4. The pulse generator 7 in FIG. 4 outputs an ultrashort unipolar pulse whose full width at half maximum is not more than, for example, 10 ps. The pulse is output from the pulse polarity modulation circuit 6, depending on the data value input into the pulse polarity modulation circuit 6, for example, as a positive-going pulse from the middle level when the data value is "0", or as a negative-going pulse from the middle level when the data value is "1".

Figure 6:
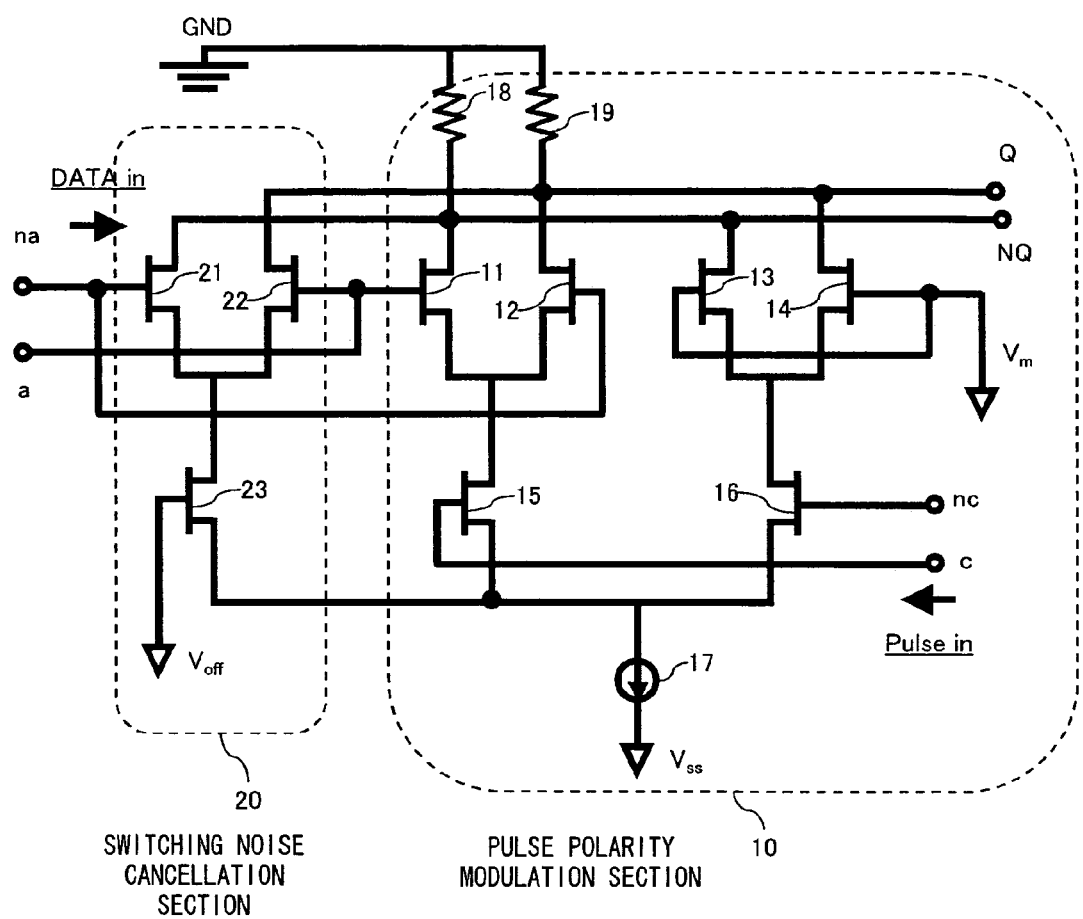
FIG. 6 is a circuit diagram of a pulse polarity modulation circuit.

FIG. 6 is a circuit diagram of a pulse modulation circuit according to this embodiment. In FIG. 6, the pulse polarity modulation circuit 6 of FIG. 4 comprises a pulse polarity modulation section 10 and a switching noise cancellation section 20. Operation of the pulse polarity modulation section 10 will be described with reference to an operation time chart in FIG. 7.

In FIG. 6, the pulse polarity modulation section 10 is a double stacked differential transistor pairs structure. That is, a differential transistor pair in a lower stage consists of a transistor 15 and a transistor 16, and the transistors 15 and 16 are coupled to their respective differential transistor pairs in an upper stage, forming a Gilbert circuit.

A transistor 11 and a transistor 12 in two differential transistor pairs in the upper stage provide output Q and inverted output NQ of the pulse modulation circuit. A fixed potential Vm is a middle level between logic "1" and "0", that is, logic "H" and "L" are applied to the gates of a transistor 13 and a transistor 14 respectively, whose gates are coupled together, which form the second differential transistor pair in the upper stage.

In the pulse polarity modulation section 10 of FIG. 6, data input a is provided to the gate of the transistor 11, and inverted data input na is provided to the gate of the transistor 12. Input pulse c is provided to the gate of the transistor 15, and inverted input pulse nc is provided to the gate of the transistor 16. The sources of the transistors 15 and 16 are connected to a current source 17 and a negative potential Vss. The drains of the transistors 11 and 12 are connected to GND through a load resistors 18 and 19 respectively.

Figure 7:
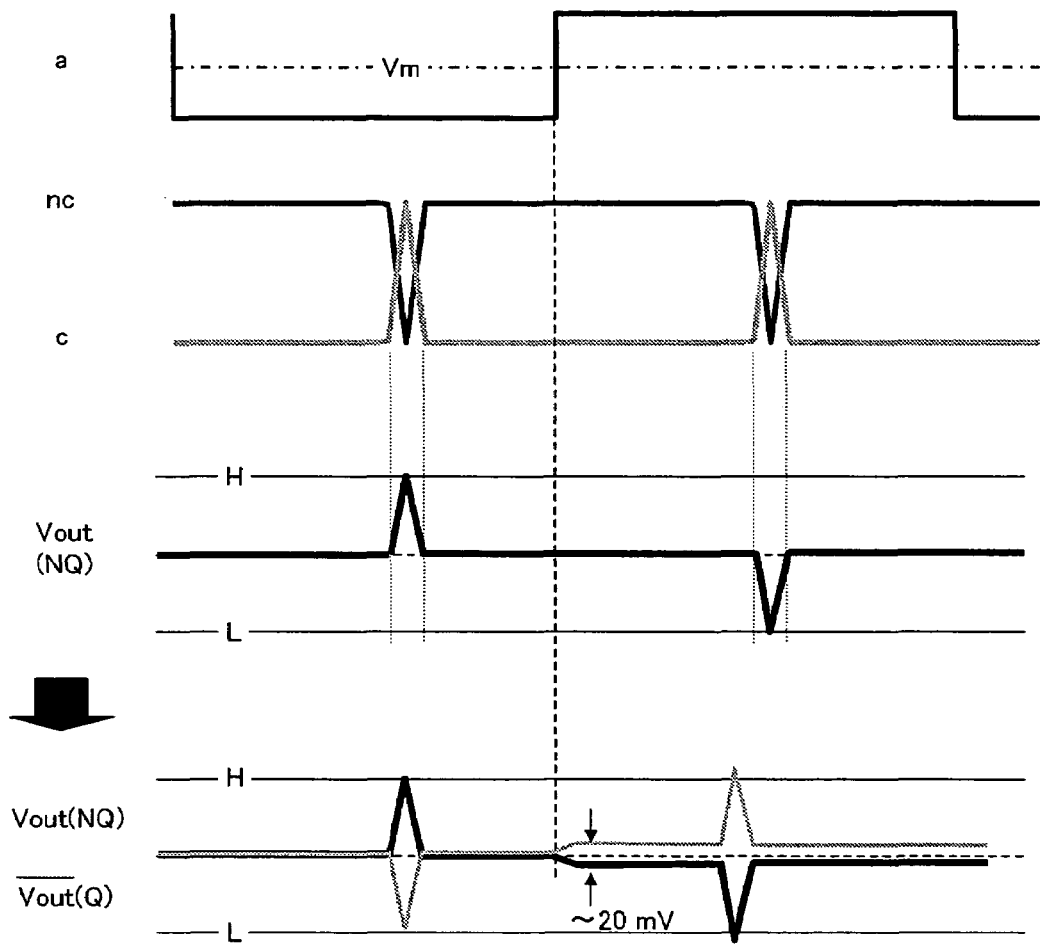
FIG. 7 is an explanatory diagram showing an operation time chart of the pulse polarity modulation section of FIG. 6.

In FIG. 7, during a period over which the data input a is "0", that is, the inverted data input na is "1", the transistor 11 is OFF. The transistor 12 may be ON but is OFF unless the transistor 15 is ON. Since the potential Vm which is the logic middle level is applied to the respective gates of the transistors 13 and 14, both the transistors are half open. In this case, at the time prior to input of the input pulse c, the inverted input pulse nc is "H" which is provided to the gate of the transistor 16; thus, the transistor 16 is ON. Therefore, a current I of the current source 17 is divided into two each flowing through the transistors 13 and 14 and resistors 18 and 19. Since the transistors 13 and 14 are half open as described, a drain voltage of the transistor 11, i.e., the reverse output voltage NQ and a drain voltage of the transistor 12, i.e., the output voltage Q are at the middle level potential between "H" and "L".

When the pulse c is input under these conditions, the transistor 15 turns ON only at the instant of the input of the pulse c. The transistor 16 turns OFF since the inverted pulse nc becomes "L". Therefore, both the currents flowing through the transistors 13 and 14 via the resistors 18 and 19 become zero.

At this time, the transistor 11 is OFF and the current flowing through the resistor 18 becomes completely zero; therefore, the inverted output NQ is momentarily the high potential, i.e., the GND potential. Since the current of the current source 17 flows through the resistor 19 via the transistors 15 and 12, the output Q is momentarily "L". The output Q then returns to its original level when the input pulse c becomes "L" again. In FIG. 7, NQ is shown as Vout (black wave form), and Q is shown as inverted Vout (grey wave form).

When the value of the input data is then inverted, that is, the data input a is "H" and the inverted data input na is "L", the transistor 12 turns OFF. Although the transistor 11 turns ON, current does not flow through the transistor 11 while the transistor 15 is OFF. The transistors 13 and 14 are half open as in the foregoing case, and the output Q and the inverted output NQ are at the middle level.

When the pulse c is input at this time, the transistor 15 is momentarily ON and the transistor 16 is momentarily OFF, as in the foregoing case. Since the transistor 11 turns ON, the reverse output NQ of its drain voltage becomes "L". On the other hand, since the transistor 12 is OFF, the output Q of its drain voltage rises to "H", i.e., the GND level in a pulse like way.

As described above, by the pulse polarity modulation section 10 in FIG. 6, unipolar pulses are converted into bipolar pulses that are symmetric with respect to the middle level from an idealistic viewpoint. However, in reality, as shown at the bottom of FIG. 7, after the data input a transitions from "L" to "H", there is noise (offset) that slightly lowers the potential of the reverse output NQ, that is, the middle level. This switching noise is amplified to a large degree by the output buffer 8 and output to external equipment as described in FIG. 4; therefore, it exerts a great influence. It is desirable to use a differential-type circuit as the output buffer 8 in FIG. 4 from the viewpoint of speed; therefore, the noise occurring at the middle level is amplified to a large degree by the differential-type output buffer.

A description will be made of the reason why the noise (offset) occurs after the data input a changes from "L" to "H" in FIG. 7. As described above, when the data input a transitions from "L" to "H", the transistor 11 is ready to turn ON. If current flows through the transistor 15, the current flows through the transistor 11. The transistor 15 is essentially OFF until the input pulse c is input. However, a minute current Ioff flows through the transistor 15 as an off-state current, i.e., a leakage current even though it is OFF. Since this current also flows through transistor 11, the potential of the reverse output NQ drops by the voltage developed across the resistor 18 due to the current. Even if the leakage current is of the order of microamperes, the voltage of the reverse output NQ, i.e., the middle level drops by the order of 10 mV for example, and this voltage drop is the noise (offset).

In order to reduce this switching noise, a switching noise cancellation section 20 in FIG. 6 is used. The switching noise cancellation section 20 comprises transistors 21 and 22 which are equivalent to the transistors 11 and 12 in the pulse polarity modulation section 10, and a transistor 23 which is connected to the junction of the sources of the transistors 21 and 22. The source of the transistor 23 (equivalent to the transistor 15) is connected to the current source 17 as in the case of the transistor 15. A potential Voff which maintains the transistor 23 in the OFF state is applied to the gate of the transistor 23. That is, the switching noise cancellation section 20 uses a SCFL (Source Coupled FET Logic) type circuit comprising the transistors 21 and 22, and together with the transistor 23 consitiutes a cascade circuit. The switching noise cancellation section 20 is combined with the pulse polarity modulation section 10 which is the Gilbert circuit in which the differential transistor pairs are double stacked.

FIG. 8 is a time chart for explaining the operation of the switching noise cancellation section in FIG. 6. As described above, the switching noise occurs because the current flowing through the load resistor 18 increases by the off-state current Ioff of the transistor 15 after the transistor 11 transitions from OFF to ON as the data input a transitions from "L" to "H". Therefore, by making the current corresponding to this increase flow through the load resistor 18 even if the data input a is "L", the switching noise is cancelled, that is, the middle level is flattened.

An off-state current Ioff of the transistor 23 (equivalent to the off-state current of the transistor 15) flows through the transistor 21 in the switching noise cancellation section 20 when the data input a is "L", that is, the inverted data input na is "H", and this current becomes zero when the inverted data input na becomes "L". Therefore, the current that increases by Ioff always flows through the load resistor 18, and the middle level is flat. When the reverse data input na becomes "L", Ioff flows through the load resistor 19 via the transistor 22, and thereby potential change (potential rise) of the middle level of the output Q in the lowest part of FIG. 7 is prevented.

The foregoing invention has been described in terms of preferred embodiments. However, those skilled, in the art will recognize that many variations of such embodiments exist. Such variations are intended to be within the scope of the present invention and the appended claims.

What is claimed is:

1. A pulse polarity modulation circuit for converting a unipolar pulse into a bipolar pulse in accordance with an input data value, wherein differential transistor pairs are double stacked, the pulse polarity modulation circuit comprising:
    a first differential transistor pair in an upper stage outputs a polarity modulation pulse, input data being provided to the first differential transistor pair;
    a second differential transistor pair in the upper stage, a middle potential between logic high and low being provided to the gates of the second differential transistor pair the gates of which are coupled together; and
    a unipolar input pulse and inverted input thereof are provided to the respective gates of a differential transistor pair in a lower stage of the double-stacked differential transistor pairs.

2. The pulse polarity modulation circuit according to claim 1, wherein transistors of the second differential transistor pair in the upper stage are connected to output terminals of the polarity modulation pulse of the first differential transistor pair.

3. The pulse polarity modulation circuit according to claim 1, further comprising a switching noise cancellation circuit connected to the output terminals of the first differential transistor pair that outputs the polarity modulation pulse in the upper stage.

4. The pulse polarity modulation circuit according to claim 3, wherein the switching noise cancellation circuit comprises a differential transistor pair that is connected to the output terminals of the polarity modulation pulse of the first differential transistor pair the sources of which are coupled together and a transistor connected to the coupled sources.

5. The pulse polarity modulation circuit according to claim 4, wherein input data and inverted input data are provided to the respective gates of the source-coupled differential transistor pair.

6. The pulse polarity modulation circuit according to claim 4, wherein a unipolar pulse and inverted input thereof are provided to the respective gates of a differential transistor pair in a lower stage of the double-stacked differential pairs, and the transistor connected to the coupled sources has the same off-state current characteristics as the transistor of the lower stage and has the unipolar pulse applied to its gate, and a potential that keeps the transistor which is connected to the coupled sources turned off in terms of direct current is provided to the gate of the transistor connected to the coupled sources.

7. The pulse polarity modulation circuit according to claim 3, wherein an amplifier that amplifies the polarity modulation pulse is connected to the output side of the pulse polarity modulation circuit.

* * * * *